United States Patent [19]

Bui

[11] Patent Number: 5,479,127
[45] Date of Patent: Dec. 26, 1995

[54] SELF-RESETTING BYPASS CONTROL FOR SCAN TEST

[75] Inventor: Cuong M. Bui, San Jose, Calif.

[73] Assignee: National Semiconductor Corporation, Santa Clara, Calif.

[21] Appl. No.: 337,257

[22] Filed: Nov. 10, 1994

[51] Int. Cl.⁶ .............................. G01R 19/00; H03L 7/00
[52] U.S. Cl. ..................... 327/174; 327/18; 327/142; 327/198; 371/22.3; 371/22.5
[58] Field of Search ............................. 327/174, 97, 142, 327/198, 18; 324/73.1; 371/22.3, 22.5, 22.6

[56] References Cited

U.S. PATENT DOCUMENTS

| | | | |
|---|---|---|---|
| 3,961,254 | 6/1976 | Cavaliere et al. | 324/73 AT |
| 4,791,357 | 12/1988 | Hyduke | 324/73 |
| 4,876,501 | 10/1989 | Ardini et al. | 324/73 R |
| 5,144,230 | 9/1992 | Katoozi et al. | 324/158 R |
| 5,197,070 | 3/1993 | Maeno | 371/22.3 |
| 5,257,267 | 10/1993 | Ishizaka | 371/22.3 |
| 5,260,949 | 11/1993 | Hashizume et al. | 371/22.3 |
| 5,355,369 | 10/1994 | Greenbergerl et al. | 371/22.3 |
| 5,357,572 | 10/1994 | Bianco et al. | 380/23 |

*Primary Examiner*—Timothy P. Callahan
*Assistant Examiner*—Kenneth B. Wells
*Attorney, Agent, or Firm*—Limbach & Limbach

[57] ABSTRACT

A self-resetting bypass control circuit is disclosed for use with scan testing of integrated circuits. The bypass control circuit includes a shift register and an OR gate. A test-enable signal is input to the shift register and to the OR gate, and the output of the shift register is also input to the OR gate. The output of the OR gate is a bypass signal that goes logic high immediately when the test enable signal goes logic high, that stays logic high while the test enable signal goes logic low momentarily, and that resets to logic low when the test enable signal goes logic low for an extended period of time.

8 Claims, 1 Drawing Sheet

SELF-RESETTING BYPASS CONTROL FOR SCAN TEST

BACKGROUND OF THE INVENTION

1. Field of the Invention

This invention relates generally to circuits used for scan testing of integrated circuits, and relates more particularly to a circuit that generates a self-resetting bypass control.

2. Description of the Relevant Art

In scan testing integrated circuits, it is customary to scan in a test stimulus, initiate a test sequence, and then scan out the result of the test for analysis. The scanning of test data into and out of the chip is controlled by a "test enable" signal applied by the tester to a test enable pin of the chip. The test enable signal goes active (logic high) for one or several clock cycles to shift the test stimulus into the chip, then goes inactive (logic low) for one clock cycle to initiate the test, and then returns to active to shift the test response out of the chip to the tester. During normal use of the chip, the test enable signal is inactive.

In such scan testing, it is common to supply an externally-generated test clock signal to the chip and to isolate internally-generated clock signals. To do so, a "clock bypass" signal is supplied to the chip to control multiplexers to select between the internal clock and the external test clock. The clock bypass signal may also be used to isolate other control signals such as internally-generated set/reset signals. The clock bypass signal is inactive during normal use of the chip.

One disadvantage of the above-described test control signals is that it requires two pins of the chip to be dedicated to test enable and clock bypass functions.

SUMMARY OF THE INVENTION

In accordance with the illustrated preferred embodiment, the present invention is a self-resetting bypass control circuit used for scan testing of an integrated circuit. An input to the bypass control circuit is a test-enable signal that goes active (logic high) to shift stimulus data into the integrated circuit, goes inactive (logic low) to initiate a test, and goes active to shift response data out of the integrated circuit. The bypass control circuit includes a shift register and an OR gate. The test-enable signal is input to the shift register, and the output of the shift register is connected to one input of the OR gate. The test-enable signal is also supplied to the other input of the OR gate. The output of the OR gate is a bypass signal, which is active (logic high) if either the test-enable signal is active (logic high), or the test-enable signal has been inactive (logic low) for less time than it takes for a bit to shift through the shift register. When the test-enable signal is inactive for sufficient time for a zero bit to shift through the shift register, the OR gate deactivates the bypass signal.

An advantage of the present invention is that it eliminates a pin of the chip that would otherwise be needed for scan testing. A pin is needed for the test-enable signal, but a pin is not needed to input the bypass signal from the tester because the bypass signal is automatically generated on-chip from the test-enable signal. The bypass signal can be used to multiplex test and internal clocks and to isolate other control signals during the testing process. The bypass control circuit is self-resetting because the shift register restores the bypass to the inactive state within a few clock cycles after the test-enable signal is inactivated. The bypass control circuit of the present invention generates an active bypass control signal during the testing phase, even when the test-enable signal briefly goes inactive to initiate the test.

The features and advantages described in the specification are not all inclusive, and particularly, many additional features and advantages will be apparent to one of ordinary skill in the art in view of the drawings, specification and claims hereof. Moreover, it should be noted that the language used in the specification has been principally selected for readability and instructional purposes, and may not have been selected to delineate or circumscribe the inventive subject matter, resort to the claims being necessary to determine such inventive subject matter.

DETAILED DESCRIPTION OF THE PREFERRED EMBODIMENT

Figure 1:
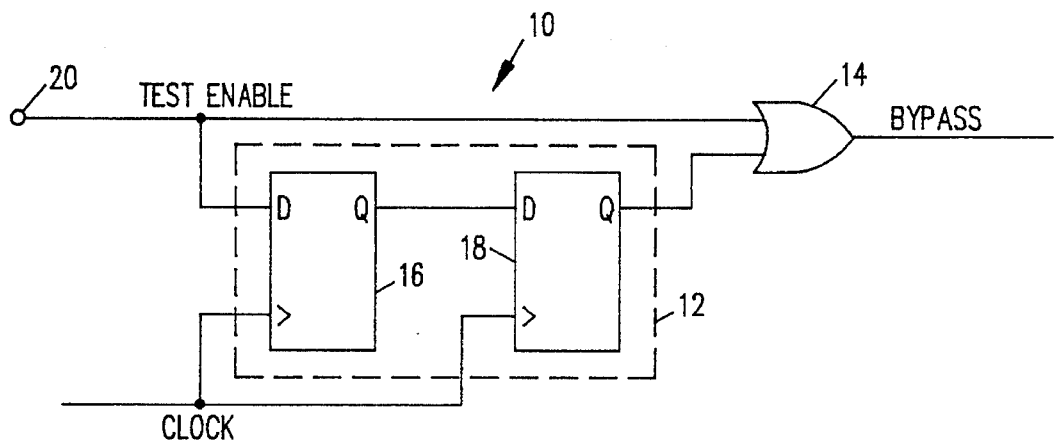
FIG. 1 is a schematic diagram of a self-resetting bypass control circuit according to the present invention.
Figure 2:
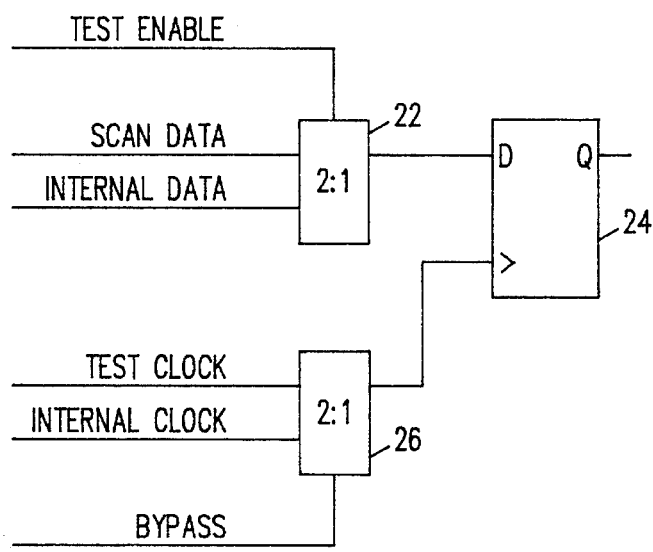
FIG. 2 is a schematic diagram of a clock and data control circuit using a bypass control signal generated by the circuit of FIG. 1.
Figure 3:
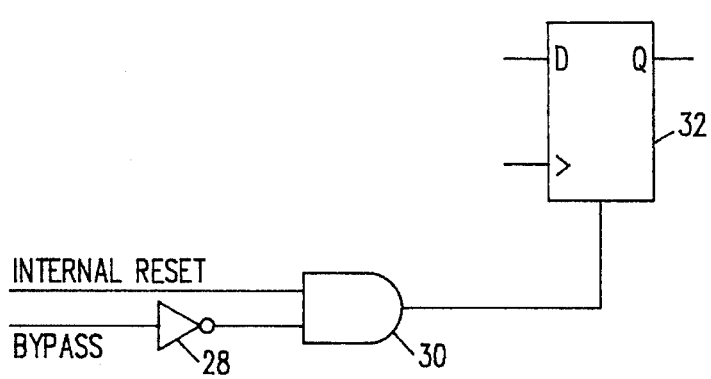
FIG. 3 is a schematic diagram of a reset control circuit using a bypass control signal generated by the circuit of FIG. 1.

FIGS. 1 through 3 of the drawings depict various preferred embodiments of the present invention for purposes of illustration only. One skilled in the art will readily recognize from the following discussion that alternative embodiments of the structures and methods illustrated herein may be employed without departing from the principles of the invention described herein.

The preferred embodiment of the present invention is a self-resetting bypass control circuit used for scan testing of an integrated circuit. As shown in FIG. 1, the circuit 10 includes a shift register 12 and an OR gate 14. The shift register 12 itself is composed of two D-type flip-flops 16 and 18. A test-enable input pin 20 of the chip is connected to one input terminal of the OR gate 14 and is also connected to a data input terminal of flip-flop 16. A Q output terminal of flip-flop 16 is connected to a data input terminal of flip-flop 18. A Q output terminal of flip-flop 18 is connected to the other input terminal of the OR gate 14. A clock signal is input to clock input terminals of the flip-flops 16 and 18. An output terminal of the OR gate 14 generates a bypass signal that is used as described below for isolating internal clock and control signals during scan testing. The bypass control circuit 10 is located on the integrated circuit chip.

During a scan test, a tester (not shown) supplies a test enable signal to the test-enable input pin 20 of a chip undergoing testing. The test enable signal is initially active (logic high state) at the beginning of the scan test to allow test stimulus data to be scanned into the chip. When the test enable signal is at the logic high state, the OR gate 14 generates a logic high signal as the bypass signal. The logic high test enable signal is also clocked into flip-flop 16 on the next clock signal. After another clock cycle, the logic high signal is clocked into the second flip-flop 18 of the shift register. The output of the flip-flop 18 is supplied to the OR gate 14, but does not change the bypass signal because the bypass output is already at the logic high state due to the logic high test enable signal that is input to the OR gate.

After the test stimulus data has been loaded into the chip, the test enable signal is deactivated by the tester (changed to logic low state) for one clock cycle to trigger the test. When this happens, the bypass signal remains active (at the logic high state) because the shift register 12 continues to supply a logic high input to the OR gate 14 during that clock cycle.

After the one clock cycle that triggers the test, the test enable signal is then activated again (changed to logic high state) to shift the test result off of the chip and to the tester for analysis. By the time the logic low test enable signal is shifted through the shift register, the test enable signal has been changed back to the logic high state, thus assuring that the OR gate 14 has at least one input at the logic high state during this test process and that the bypass signal remains at the logic high state.

When the scan test is completed, the test enable signal is deactivated (changed to a logic low state). After two clock cycles, the logic low state of the test enable signal is shifted through the shift register 12. At that point, both inputs to the OR gate 14 are logic low, which results in a deactivated bypass signal (logic low state). Thus, the bypass control circuit 10 automatically resets the bypass signal to the logic low state after completion of the scan test.

As shown in FIG. 2, the test enable signal is utilized, among other things, to control a multiplexer 22 to select between scan data and internally-generated data. The selected data is input, for example, to a flip-flop 24 for capture and further processing. Similarly, the bypass signal is used to control a multiplexer 26 to select between a test clock and an internal clock. The selected clock is used to clock the flip-flop 24, among other functions.

As shown in FIG. 3, the bypass signal is also used to isolate control signals such as internal reset signals. The bypass signal is input to an inverter 28, which has an output that is input to one input terminal of an AND gate 30. The internal reset signal is input to the other input terminal of the AND gate 30. The bypass signal acts as a gate to either connect the reset signal to or disconnect the reset signal from a reset terminal of a flip-flop 32. These are a few exemplary uses of the test enable and bypass signals, and are not intended to be an exhaustive list of all possible uses for these signals.

From the above description, it will be apparent that the invention disclosed herein provides a novel and advantageous bypass control circuit for scan testing. The foregoing discussion discloses and describes merely exemplary methods and embodiments of the present invention. For example, the bypass control circuit has been described in terms of "activated" and "deactivated" signals and "logic high" and "logic low" states. However, other equivalent circuits could be implemented for the inverse logic states. Furthermore, while the shift register is illustrated as having two flip-flops, more flip-flops would be needed if the momentary low of the test enable signal lasts more than one clock cycle.

As will be understood by those familiar with the art, the invention may be embodied in other specific forms without departing from the spirit or essential characteristics thereof. Accordingly, the disclosure of the present invention is intended to be illustrative, but not limiting, of the scope of the invention, which is set forth in the following claims.

What is claimed is:

1. A bypass control circuit for generating a bypass control signal that is active during scan testing of an integrated circuit, wherein the bypass control circuit comprises:

a test-enable input pin located on the integrated circuit and that receives a test enable signal, wherein the test enable signal changes state from active to inactive and stays inactive for a certain number of clock cycles and then changes to active again during a scan test of the integrated circuit;

a shift register located on the integrated circuit and having a data input terminal connected to the test-enable input pin and having a data output terminal, wherein data is shifted through the shift register from the data input terminal to the data output terminal during a number of clock cycles that is equal to or greater than said certain number of clock cycles that the test enable signal is inactive during a scan test; and an OR gate located on the integrated circuit and having one input terminal connected to the test-enable input pin and another input terminal connected to the data output terminal of the shift register, wherein the OR gate outputs the bypass control signal at an output terminal thereof.

2. The bypass control circuit as recited in claim 1 wherein the shift register includes a first flip-flop having a data input terminal connected to the test-enable input pin and further includes a second flip-flop having a data input terminal connected to a Q output terminal of the first flip-flop, wherein a Q output terminal of the second flip-flop is said data output terminal of the shift register, and wherein said certain number of clock cycles that the test enable signal is inactive during a scan test is equal to one.

3. A bypass control circuit for scan testing of an integrated circuit, wherein the bypass control circuit is located on the integrated circuit and comprises:

a test-enable input pin that receives a test enable signal, wherein the test enable signal goes active to shift stimulus data for Setting the initial conditions of a test into the integrated circuit, then goes inactive to enable the start of said test, and then goes active to shift response data for indicating the result of said test out of the integrated circuit;

a first D-type flip-flop having a data input terminal connected to the test-enable input pin;

a second D-type flip-flop having a data input terminal connected to a Q output terminal of the first D-type flip-flop; and an OR gate having one input terminal connected to the test-enable input pin and another input terminal connected to a Q output terminal of the second D-type flip-flop, wherein the OR gate outputs a bypass control signal at an output terminal thereof.

4. The bypass control circuit as recited in claim 3 further comprising a multiplexer having two selectable input terminals and one output terminal and having a control input terminal coupled to the test-enable input pin.

5. The bypass control circuit as recited in claim 3 further comprising a multiplexer having two selectable input terminals and one output terminal and having a control terminal coupled to the output terminal of the OR gate.

6. The bypass control circuit as recited in claim 3 further comprising an AND gate having one input terminal coupled to the output terminal of the OR gate.

7. The bypass control circuit as recited in claim 6 wherein said one input terminal of the AND gate is coupled through an inverter to the output terminal of the OR gate.

8. A bypass control circuit for generating a bypass control signal that bypasses internal control or timing signals during testing of an integrated circuit, wherein the bypass control circuit is located on the integrated circuit and comprises:

a test-enable input pin that receives a test enable signal that changes state during testing but is inactive when not testing;

a first flip-flop having a data input terminal connected to the test-enable input pin;

a second flip-flop having a data input terminal connected to a Q output terminal of the first flip-flop; and an OR gate having one input terminal connected to the test-enable input pin and another input terminal connected to a Q output terminal of the second flip-flop, wherein the OR gate outputs the bypass control signal at an output terminal thereof.

\* \* \* \* \*